United States Patent
Jung et al.

(10) Patent No.: US 11,967,671 B2
(45) Date of Patent: Apr. 23, 2024

(54) DISPLAY PANEL AND LARGE DISPLAY DEVICE USING SAME

(71) Applicant: SAMSUNG ELECTRONICS CO., LTD., Suwon-si (KR)

(72) Inventors: Youngki Jung, Suwon-si (KR); Jinho Kim, Suwon-si (KR); Taesoon Park, Suwon-si (KR); Sangmin Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 679 days.

(21) Appl. No.: 17/258,361

(22) PCT Filed: Jul. 11, 2019

(86) PCT No.: PCT/KR2019/008546
§ 371 (c)(1),
(2) Date: Jan. 6, 2021

(87) PCT Pub. No.: WO2020/017823
PCT Pub. Date: Jan. 23, 2020

(65) Prior Publication Data
US 2021/0273147 A1 Sep. 2, 2021

(30) Foreign Application Priority Data
Jul. 18, 2018 (KR) .......... 10-2018-0083706

(51) Int. Cl.
*H01L 27/15* (2006.01)
*H01L 31/12* (2006.01)
(Continued)

(52) U.S. Cl.
CPC ............ *H01L 33/62* (2013.01); *H01L 27/156* (2013.01)

(58) Field of Classification Search
CPC ..... H01L 33/62; H01L 27/156; H01L 25/167; H01L 25/0753; H10K 59/131; H10K 59/123; H10K 19/20
(Continued)

(56) References Cited

U.S. PATENT DOCUMENTS 6,025,901 A * 2/2000 Adachi ............... G02F 1/13452
349/158
9,412,772 B1 8/2016 Ghali
(Continued)

FOREIGN PATENT DOCUMENTS

KR 10-2017-0102181 A 9/2017
KR 10-2017-0135468 A 12/2017
(Continued)

OTHER PUBLICATIONS

International Search Report (PCT/ISA/210) dated Oct. 16, 2019 by the International Searching Authority in counterpart International Patent Application No. PCT/KR2019/008546.
(Continued)

*Primary Examiner* — Theresa T Doan
(74) *Attorney, Agent, or Firm* — Sughrue Mion, PLLC

(57) ABSTRACT

A display substrate is disclosed. The disclosed display substrate can comprise: a thin film transistor substrate; a plurality of micro LEDs arranged on one surface of the thin film transistor substrate; a rear substrate having one surface coupled to the other surface of the thin film transistor substrate, and having at least a part of an edge protruding further than the edge of the thin film transistor substrate so as to form a stepped part together with the thin film transistor substrate; and a plurality of wirings formed on the stepped part and the other surface of the rear substrate so as to electrically connect the one surface of the thin film transistor substrate and the other surface of the rear substrate.

12 Claims, 14 Drawing Sheets

(51) Int. Cl.
*H01L 33/00* (2010.01)
*H01L 33/62* (2010.01)

(58) Field of Classification Search
USPC .......................................................... 257/79
See application file for complete search history.

(56) References Cited

U.S. PATENT DOCUMENTS

| | | |
|---|---|---|
| 10,038,154 B2 | 7/2018 | Lee et al. |
| 2013/0146859 A1* | 6/2013 | Hartmann ............. H01L 21/707 |
| | | 438/584 |
| 2017/0012095 A1 | 1/2017 | Zhong et al. |
| 2017/0040306 A1 | 2/2017 | Kim et al. |
| 2018/0069072 A1 | 3/2018 | Kajiyama et al. |
| 2018/0090378 A1 | 3/2018 | Lu et al. |
| 2020/0203235 A1* | 6/2020 | Jung ....................... H01L 22/32 |

FOREIGN PATENT DOCUMENTS

| | | | |
|---|---|---|---|
| KR | 10-2018-0003353 A | 1/2018 | |
| KR | 10-2018-0028821 A | 3/2018 | |
| KR | 10-2018-0075827 A | 7/2018 | |

OTHER PUBLICATIONS

Written Opinion (PCT/ISA/237) dated Oct. 16, 2019 by the International Searching Authority in counterpart International Patent Application No. PCT/KR2019/008546.
Communication dated Oct. 21, 2022 by the Korean Patent Office for Korean Patent Application No. 10-2018-0083706.

* cited by examiner

DISPLAY PANEL AND LARGE DISPLAY DEVICE USING SAME

TECHNICAL FIELD

The disclosure relates to a display panel and a large display device using the same. More particularly, the disclosure relates to a display panel which implements bezel-less technology by forming wiring to a front surface and a rear surface of a substrate through a stepped part of a substrate to move a bonding area of a driver integrated circuit (IC) to the rear surface of the substrate and a large display device using the same.

BACKGROUND ART

Display devices express a variety of colors while being operated on a pixel or a sub-pixel basis, and the operation is controlled by each of the pixel or the sub-pixel thin film transistor (TFT). A plurality of TFTs are arranged on a flexible substrate, a glass substrate, or a plastic substrate, and are referred to as TFT substrates.

The TFT substrates described above may be utilized as a flexible device or a substrate which drives a display ranging from a small size wearable device (e.g., wearable watch, etc.) to a large size television (TV) reaching tens of inches. In order to drive the TFT substrate, the TFT substrate is connected to an external integrated circuit (IC) or a driver IC which may apply current to the TFT substrate.

Recently, because organic materials are not used unlike organic light emitting diodes (OLED), there is no burn-in phenomenon and TFT substrates mounted with micro light emitting diodes (LED) with long lifespans are being produced. The TFT substrates mounted with micro LED as described above may be connected to each circuit through a Chip on Glass (COG) bonding, a Film on Glass (FOG) bonding, or the like. For this connection, an area having a certain area at an edge of the TFT substrate, that is a bezel area, must be secured.

Currently, research and development on bezel-less technology which reduces or eliminates a bezel area is continuously under development so that an active area, to which an image is displayed in the display panel that is applied with micro LEDs, may be maximized, and as a part thereof, a display panel is disclosed in U.S. Pat. No. 9,367,094 (published on Jun. 14, 2016). Currently, a bezel-less display panel is applied to small display devices such as smartphones and large display devices such as a TV, a display board, or the like.

DISCLOSURE

Technical Problem

The disclosure provides a display panel which implements bezel-less technology by forming wiring to a front surface and a rear surface through a stepped part of a substrate to minimize a bezel area of the substrate.

In addition, with respect to a display device which uses micro light emitting diodes (LEDs), the disclosure provides a display panel with increased micro LED packing density by arranging a connection wiring which connects the TFT substrate with the driver IC at an outer side of a micro LED mounting surface in mounting the plurality of micro LEDs to the TFT substrate.

In addition, the disclosure provides a large display device capable of preventing in advance a seam from appearing in-between each of the display panels so that a pitch between the outermost pixels of the display panels adjacent with one another may be maintained identically with a pitch of a signal display panel for large format display (LFD) device which are produced by connecting in plurality display panels which have implemented with bezel-less technology.

Technical Solution

According to an embodiment, a display panel includes a thin film transistor (TFT) substrate; a plurality of micro light emitting diodes (LEDs) arranged at one surface of the TFT substrate; a rear substrate having a one surface coupled to a other surface of the TFT substrate and having at least a part of an edge protruding further than an edge of the TFT substrate to form a stepped part with the TFT substrate; and a plurality of wirings formed at the stepped part and a other surface of the rear substrate to electrically connect the one surface of the TFT substrate with the other surface of the rear substrate.

The each of the plurality of wirings may include a first wiring formed to extend from the other surface of the rear substrate and penetrate an edge part of the rear substrate; and a second wiring formed in the stepped part to electrically connect with the first wiring.

In the area corresponding to the rear substrate in the stepped part, a via hole may be formed, and a part of the first wiring may be formed in the via hole.

The second wiring may be electrically connected from a part of the first wiring formed in the via hole along the stepped part to the first connection pad placed on one surface of the TFT substrate.

The second wiring may be formed in a pattern type applied to the stepped part, or formed as a metal wiring type.

The each of the plurality of wirings may include a first wiring formed to penetrate an edge part of the rear substrate; and a second wiring formed in the stepped part to electrically connect with the first wiring.

The rear substrate may further include a protection layer configured to cover the first wiring.

The rear substrate may be comprised of any one from among a Polyimide (PI), a Polyethylene Terephthalate (PET), a Polyethersulfone (PES), a Polyethylene Naphthalate (PEN) or Polycarbonate (PC).

The rear substrate may be a flexible plastic film or the rear substrate may be a glass film.

The TFT substrate may include a flexible film substrate; and a plurality of TFT wiring layers formed on the flexible film substrate.

According to an embodiment, a display panel includes a substrate to which a stepped part is formed at an edge; a plurality of micro light emitting diodes (LED) arranged at one surface of the substrate; a first wiring extending to a via hole formed at the rear substrate of the substrate and the stepped part; and a second wiring formed in the stepped part to electrically connect the first wiring exposed in the via hole with a connection pad formed on a front surface of the substrate. In this case, the substrate may include a TFT substrate; and a rear substrate coupled to a rear surface of the TFT substrate and formed with a synthetic resin.

According to an embodiment, with respect to a large display device with a plurality of display panels consecutively connected, each of the display panels include a thin film transistor (TFT) glass substrate; a plurality of micro light emitting diodes (LEDs) arranged at one surface of the TFT substrate; a rear substrate having a one surface coupled to a other surface of the TFT substrate and having at least a part of an edge protruding further than an edge of the TFT substrate to form a stepped part with the TFT substrate; and a plurality of wirings formed at the stepped part and a other surface of the rear substrate to electrically connect the one surface of the TFT substrate with the other surface of the rear substrate, and the micro LED is configured to form one pixel per three micro LEDs, and a plurality of pixels provided in each of the display panels is placed to an identical first pitch, and pixels of display panels which are adjacent to each other from among the pixels of the display panel is placed to a second pitch identical to the first pitch.

According to the various embodiments in the disclosure, by forming wiring to electrically connect the front surface and the rear surface of the TFT substrate through the stepped part of the TFT substrate, a dummy area in the TFT substrate may be minimized facilitating the implementation of a bezel-less display panel.

In addition, when a large display device is formed by connecting a plurality of bezel-less display panels, display quality may be improved because a seam does not appear in the part in which each display panel is connected.

DETAILED DESCRIPTION OF EXEMPLARY EMBODIMENTS

Figure 1A:
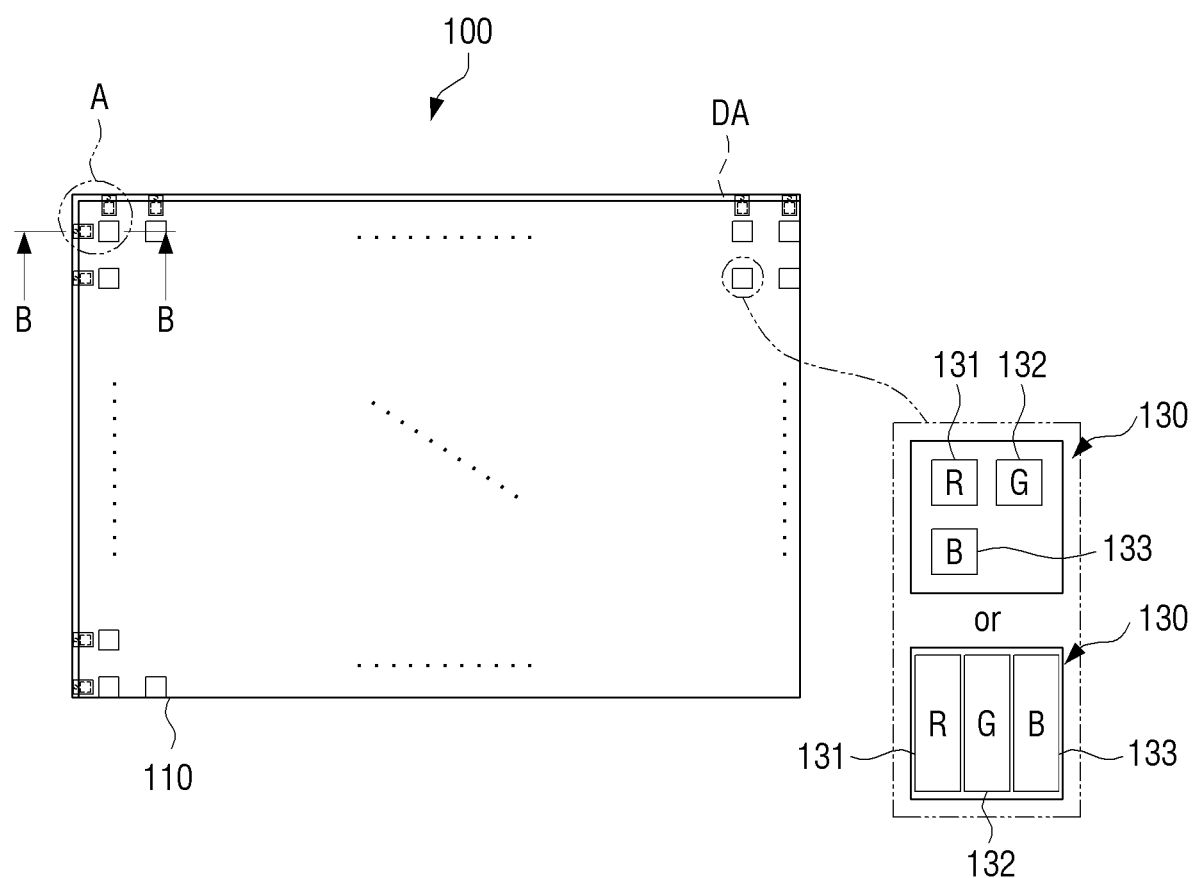
FIG. 1A is a front view illustrating a display panel according to an embodiment of the disclosure.

In describing the embodiments, based on determining that a detailed description of related known technologies may unnecessarily confuse the gist of the disclosure, the detailed description may be omitted. In addition, redundant descriptions of same configurations may be omitted.

Suffixes such as "part" with respect to the elements used in the description below may be added or used interchangeably to facilitate the describing of the disclosure, and the suffix itself is not intended to have a differentiating meaning or function.

The terms used herein are used to describe an embodiment, and are not intended to limit and/or restrict the disclosure. A singular expression includes a plural expression, unless otherwise specified.

In the disclosure, it is to be understood that the terms such as "comprise," "include," or the like are used herein to designate a presence of a characteristic, number, step, operation, element, component, or a combination thereof, and not to preclude a presence or a possibility of adding one or more of other characteristics, numbers, steps, operations, elements, components or a combination thereof.

The terms such as "first," "second," "1st," "2nd," or the like used in the various embodiments may use various elements regardless of order and/or importance, and are used to distinguish one element from another element without limiting the corresponding elements.

When a certain element (e.g., first element) is indicated as being "(operatively or communicatively) coupled with/to" or "connected to" another element (e.g., second element), it is to be understood that the certain element may be directly coupled to another element or may be coupled through other element (e.g., third element). On the other hand, when a certain element (e.g., first element) is indicated as being "directly coupled with/to" or "directly connected to" another element (e.g., second element), it is to be understood that other element (e.g., third element) may not be present between the certain element and the another element.

The display panel according to the embodiments may form a stepped part at an edge of a substrate, and electrically connect a plurality of light emitting elements arranged on a front surface of the substrate which passes through the stepped part with circuitry which are placed on a rear surface.

The stepped part formed on the substrate may correspond to a dummy area which excludes an active area to which an image is displayed by a plurality of the light emitting elements arranged on the front surface of the substrate.

The substrate may include a TFT substrate and a rear substrate which is coupled to the rear surface of the TFT substrate. The TFT substrate may be comprised of any one substrate from among a glass substrate, a flexible substrate, or a plastic substrate and a plurality of TFTs formed on one surface of the corresponding substrate, and may be referred to as a backplane.

The rear substrate may be comprised of a thin film form or a thin glass form of with a thickness of several tens of μm (e.g., 50 μm or less). When the rear substrate is comprised in a thin film form, the rear substrate may be formed of a plastic material, for example, any one material from among Polyimide (PI), Polyethylene Terephthalate (PET), Polyethersulfone (PES), Polyethylene Naphthalate (PEN) or Polycarbonate (PC). As described above, when the rear substrate is formed with a thin flexible plastic film or a thin glass film, the forming a via hole in the rear substrate at which wiring is formed may be facilitated. Accordingly, the display panel according to an embodiment of the disclosure may reduce production cost for forming via holes.

In addition, because the rear substrate may be coupled to the rear surface of the TFT substrate by an attachment process after forming the TFT substrate, it is not necessary for the rear substrate to be inserted into a process which takes place within a high temperature chamber to form a TFT substrate. The display panel according to an embodiment may couple the rear substrate to the TFT substrate after the rear substrate is produced separately from the TFT substrate. Accordingly, the display panel according to an embodiment may, because it is not necessary to insert the rear substrate in the TFT substrate process, fundamentally prevent problems such as a crack generating around the via hole by a coated metal wiring due to different thermal expansion rates between glass and metal at high temperature in the via hole formed on the glass substrate of the TFT, contamination of the metal wiring by an etchant, or equipment chamber contamination.

The display panel according to an embodiment may electrically connect a first connection pad formed on the front surface of the TFT substrate and a second connection pad formed on the rear surface of the rear substrate through the metal wiring. The metal wiring may include a first wiring formed in the via hole formed at one part (a part adjacent to an edge of the rear surface of the rear substrate) of the rear surface of the rear substrate and the stepped part of the substrate, and a second wiring formed at a other part (a part adjacent to an edge of the front surface of the rear substrate and a part adjacent to an edge of the front surface of the TFT substrate) of the stepped part of the substrate.

The light emitting element which is applied to the display substrate according to an embodiment may be a micro light emitting diode (LED), and each micro LED may form a red color sub-pixel (R sub-pixel), a green color sub-pixel (G sub-pixel), or a blue color sub-pixel (B sub-pixel). A single pixel may be comprised of three R, G, B sub-pixels, and each of the TFT of the TFT substrate may be formed in sub-pixel basis.

Because the micro LED self-emits light, a backlight unit, a liquid crystal layer, a polarizer may be omitted, and a thin glass layer may be placed at an upper most level. Accordingly, the micro LED may be formed at a thickness thinner than an OLED.

In addition, because the micro LED uses inorganic materials, a burn-in phenomenon may not occur, luminescence efficiency may be about 3 fold higher than an OLED which uses organic materials, and power consumption may be halved. Accordingly, if a display panel mounted with micro LEDs is applied to a smartphone, the screen may be clearly seen in even bright places and battery use time may be prolonged.

In addition, because the micro LED may even be mounted on a substrate with curvature through a roller transfer method and elements may be attached even on substrates which easily stretch like rubber making it possible to produce a transparent display which freely changes form, there is no substantial limitation to the substrate which may be mounted.

In addition, the micro LED may be produced to an ultra-small size of 100 μm or less and may implement ultra-high definition when applied to a TV of various sizes or small wearable devices (smart watch, etc.). As described above, micro LEDs which are capable of implementing ultra-high definition may maximize image quality when applied to a virtual reality (VR) and an augmented reality (AR) headset because conversion time (time taken until color is fully changed) is on a nanosecond basis.

In addition, the display panel according to the disclosure may, based on the including the TFT substrate and the rear substrate which is coupled to the rear surface of the TFT substrate, include a first wiring formed from a first connection pad which is formed on the rear surface of the rear substrate to the via hole penetratingly formed in the stepped part, and a second wiring formed from one end part of the first wiring formed in the via hole to a second connection pad which is formed on the front surface of the TFT substrate. The via hole may be formed on the rear substrate, and preferably formed at an area adjacent to the edge of the rear substrate.

The display panel according to the embodiments of the disclosure as described above may by minimizing the dummy area and maximizing the active area, implement bezel-less technology. As described above, under a structure for implementing the bezel-less technology of the disclosure, because the dummy area is reduced, the active area may be relatively increased. Accordingly, the packing density of the micro LED with respect to a unit display panel may be increased.

As described above, based on connecting a plurality of display panels implemented with bezel-less technology in a tiled type method, the active area may be maximized or a large format display (LFD) device capable of implementing a whole area of the front surface as a pixel light emitting area may be provided. In this case, each display panel may, because the pitch between each of the pixels of the display panel adjacent to one another may be identically maintained with the pitch between each of the pixels within a signal display panel based on the dummy area in the front surface being minimized, fundamentally prevent a seam from appearing at a connection part between each of the display panels.

The various embodiments of the disclosure will be described in detail below with reference to the accompanying drawings.

Figure 1B:
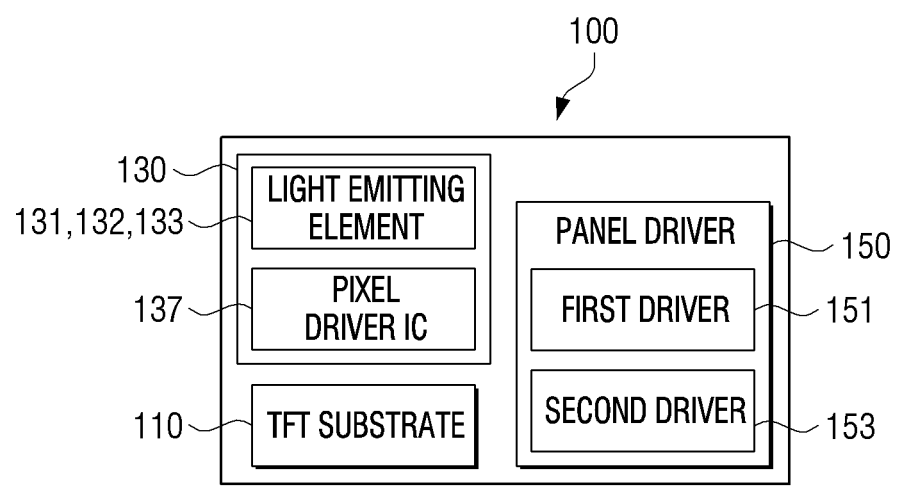
FIG. 1B is a block diagram illustrating a display panel according to an embodiment of the disclosure.
Figure 2:
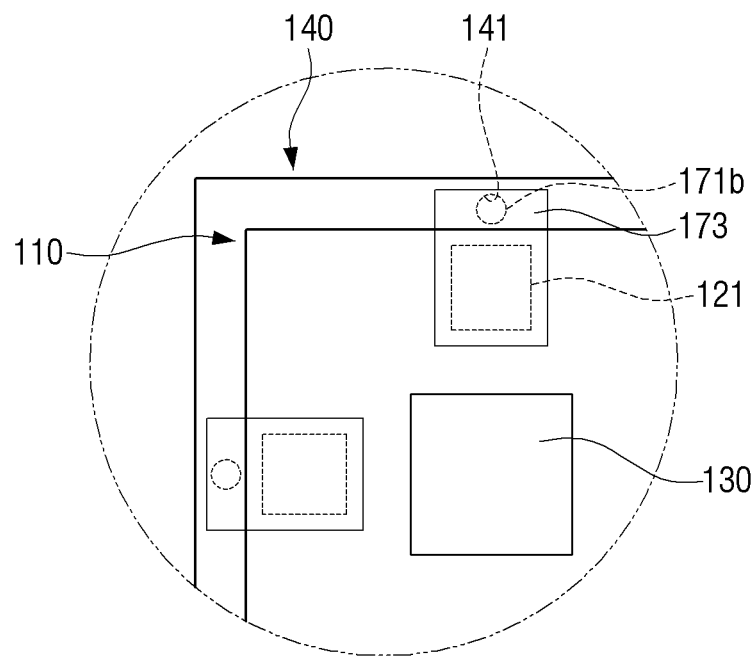
FIG. 2 is an enlarged view illustrating part A illustrated in FIG. 1A.
Figure 3:
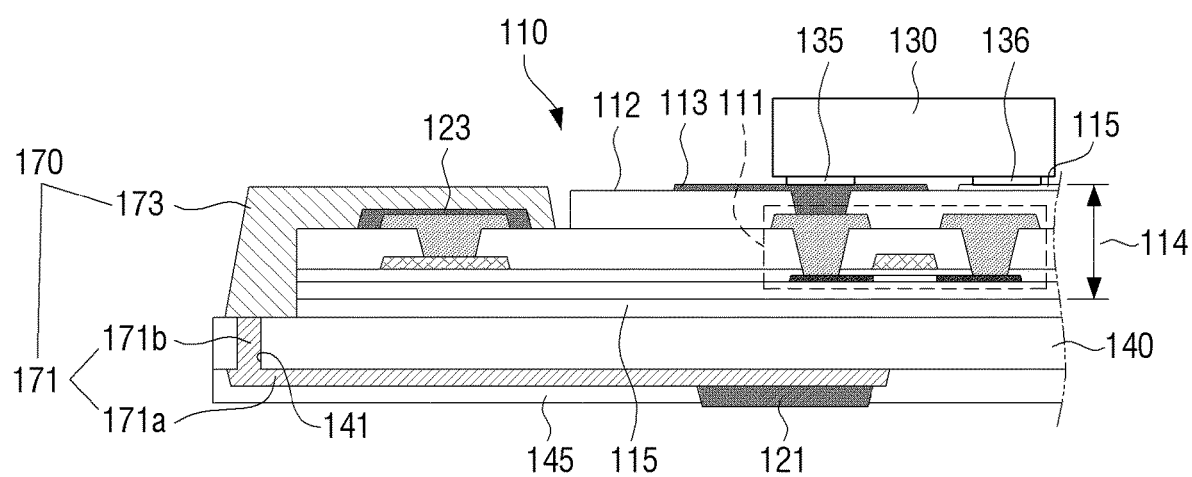
FIG. 3 is a cross-sectional view taken along line B-B illustrated in FIG. 1A.

FIG. 1A is a front view illustrating a display panel according to an embodiment of the disclosure, FIG. 1B is a block diagram illustrating a display panel according to an embodiment of the disclosure, FIG. 2 is an enlarged view illustrating part A illustrated in FIG. 1A, and FIG. 3 is a cross-sectional view taken along line B-B illustrated in FIG. 1A.

Referring to FIGS. 1A and 1B, the display panel 100 according to an embodiment may include a TFT substrate 110 formed with a plurality of pixel driver ICs 137, a plurality of pixels 130 arranged on one surface of the TFT substrate (hereinafter, referred to as 'a front surface of the TFT substrate'), a rear substrate 140 coupled to a other surface of the TFT substrate (hereinafter, referred to as 'a rear surface of the TFT substrate'), a panel driver 150 configured to generate a control signal and provide the generated control signal to each of the pixel driver ICs 137 formed on the TFT substrate, and a wiring 170 which is formed at a rear panel with the TFT substrate 110 and electrically connects the pixel driver IC 137 with the panel driver 150.

Referring to FIGS. 2 and 3, the TFT substrate 110 may include a base film 115 (referring to FIG. 3), and a TFT wiring layer 114 which is stacked on a front surface of the base film 115.

The base film 115 may be comprised of a synthetic resin formed to a thickness of about 10 μm to 20 μm.

The TFT wiring layer 114 may include a plurality of data signal lines placed horizontally to control the plurality of pixels 130 arranged on one surface of the base film 115, a plurality of gate signal lines placed vertically, and a plurality of transistors 111 electrically connected to each line.

The front surface of the TFT substrate may be divided into the active area, which is the area where an image may be displayed through the plurality of pixels 130, and the dummy area which is the remaining area excluding the active area. The dummy area may be at least any one edge part from among the four edge parts of the TFT substrate 110.

In the disclosure, the dummy area may be defined as an area which includes up to an edge part of the rear substrate 140 which is more protruded than an outer part of the TFT substrate by adding the dummy area to the edge part of the TFT substrate 110. In this case, the TFT substrate and the stepped part formed by the rear substrate which is stacked on the rear surface of the TFT substrate may be provided in the dummy area.

Referring to FIG. 1A, the plurality of pixels 130 may be arranged in a matrix type on the front surface of the TFT substrate 110. Each pixel 130 may include three R, G and B sub-pixels 131,132 and 133 corresponding to the red, green and blue colors. Each of the sub-pixels 131, 132 and 133 may be comprised of a micro light emitting diode (LED) which emits the color of the corresponding sub-pixel. In the disclosure, the 'sub-pixel' and the 'micro LED' may be considered the same configuration.

The R, G and B sub-pixels 131,132 and 133 may be arranged in the matrix type within one pixel 130, or may be sequentially arranged. However, the placement type of the sub-pixels is merely one example, and the R, G and B sub-pixels 131,132 and 133 may be placed in a variety of types within each of the single pixels 130. The each of the single pixels 130 may include a pixel driver IC for driving the micro LED corresponding to each of the R, G and B sub-pixels 131,132 and 133.

In the disclosure, one pixel may be defined as including three pixel driver ICs 137 to drive each of the R, G and B sub-pixels 131,132 and 133.

The R, G and B sub-pixels 131,132 and 133 may be connected to each of a positive electrode 113 which is extended from the transistor 111 and a negative electrode 117 which is formed on the front surface of the TFT substrate 110 through a pair of electrodes 135 and 136, respectively.

The rear substrate 140 may be attached to the rear surface of the TFT substrate 110 and the edge part of the rear substrate 140 may form the stepped part with the edge part of the TFT substrate 110 as described above.

The rear substrate 140 may be formed to have a thickness thicker than the TFT substrate 110 to be able to support the TFT substrate 110. For example, the rear substrate 140 may be formed to a thickness of about 20 μm to 50 μm.

In the area corresponding to the rear substrate 140 in the stepped part, a plurality of via holes 141 may be formed. In each of the plurality of via holes 141, a via hole wiring 171b corresponding to a part of the first wiring 171 may be formed. The remaining part of the first wiring 171 may be an extension wiring 171a of the first wiring 171 formed on the rear surface of the rear substrate 140. In this case, the extension wiring 171a and the via hole wiring 171b may be electrically connected while concurrently forming the first wiring 171.

The via hole wiring 171b may be electrically connected to one end of the second wiring 173 formed along the stepped part. As described above, the extension wiring 171a of the first wiring and the second wiring 173 may be electrically interconnected through the via hole wiring 171b of the first wiring.

The extension wiring 171a of the first wiring 171 may be electrically connected to the first connection pad 121 formed on the rear surface of the rear substrate. The second wiring 173 may be electrically connected to the second connection pad 123 formed on the front surface of the TFT substrate 110.

The first connection pad 121 may be placed on the rear surface of the rear substrate 140, and electrically connected to the panel driver 150. The second connection pad 123 may be electrically connected to each of the sub-pixels 131, 132 and 133 through wiring which is formed on the TFT substrate 110.

The rear substrate 140 may be formed of a synthetic resin, for example, any one from among Polyimide (PI), Polyethylene Terephthalate (PET), Polyethersulfone (PES), Polyethylene Naphthalate (PEN) or Polycarbonate (PC) so as to facilitate the forming of via holes compared to a glass substrate according to the related art. In addition, the rear substrate 140 may be produced as a flexible plastic substrate.

The rear substrate 140 may be configured so that a protection layer 145 to cover the extension wiring 171a of the first wiring 171 is stacked on the rear surface of the rear substrate 140. The protection layer 145 may be formed of an insulating material. It may be preferable for the first connection pad 121 which is electrically connected with the extension wiring 171a to be exposed without being covered by the protection layer 145 so that the first connection pad 121 which is electrically connected with the extension wiring 171a may electrically connect to the panel driver 150.

The panel driver 150 may be connected to the TFT substrate 110 via a Chip on Glass (COG) bonding method or a Film on Glass (FOG) bonding method. The panel driver 150 as described above may drive the plurality of pixel driver ICs 137 and control light emissions of the plurality of micro LEDs 131, 132 and 133 which are electrically connected to each of the plurality of pixel driver ICs 137. Specifically, the panel driver 150 may control the plurality of pixel driver ICs for each line through the first driver 151 and the second driver 153.

The first driver 151 may generate a control signal for sequentially controlling the plurality of horizontal lines formed on the TFT substrate 110 for each line per image frame, and transmit the generated control signal to the pixel driver IC connected to each of the corresponding lines. The second driver 153 may generate a control signal for sequentially controlling the plurality of vertical lines formed on the TFT substrate 110 for each line per image frame, and transmit the generated control signal to each of the pixel driver ICs 137 which are connected to the corresponding lines.

The wiring 170 may include a first wiring 171 which is formed from the first connection pad 121 along the rear surface of the rear substrate 140 to the inside of the via hole 140, and a second wiring 173 which is electrically connected to the first wiring 171 along the stepped part to the second connection pad 123. The wiring 170 may be provided in plurality spaced apart along the stepped part and the rear surface of the edge part of the rear substrate. In this case, the first and second connection pads 121 and 123 may be provided in plurality to connect to each of the both ends of the plurality of wirings 170.

The first wiring 171 may include an extension wiring 171a and a via hole wiring 171b as described above. The extension wiring 171a may be formed at the edge part of the rear surface of the rear substrate 140. The via hole wiring 171b may be formed inside of the via hole 141. The via hole wiring 171b may be formed to fully fill the via hole 141, and may be applied so as to have a predetermined thickness of an inner circumferential surface of the via hole 141.

The extension wiring 171a of the first wiring and the via hole wiring 171b which are electrically interconnected may be formed through different processes, respectively. However, the embodiment is not limited thereto, and the extension wiring 171a and the via hole wiring 171b may be concurrently formed by using a deposition process (e.g., sputtering process). A mask used in the deposition process may be applied with the TFT substrate 110 and a mask (not shown) covering the rear substrate 140. In this case, the mask may be produced so as to not cover the area to which a part 171a of the first wiring is to be formed and the via hole 141 in which the via hole wiring 171b is to be formed.

The first connection pad 121 may be electrically connected to the extension wiring 171a of the first wiring 171.

However, the embodiment is not limited thereto, and the first connection pad 121 may be formed at a location that directly connects electrically to the via hole wiring 171b of the first wiring 171. In this case, the extension wiring 171a of the first wiring 171 may be omitted.

The second wiring 173 may be formed to have a thickness of several μm to several tens of μm in the stepped part. The second wiring 173 may be formed by deposition through one from among the sputtering process, the thermal evaporation process, or the e-beam evaporation process. In addition, the second wiring 173 may be formed through the printing process.

Figure 4A:
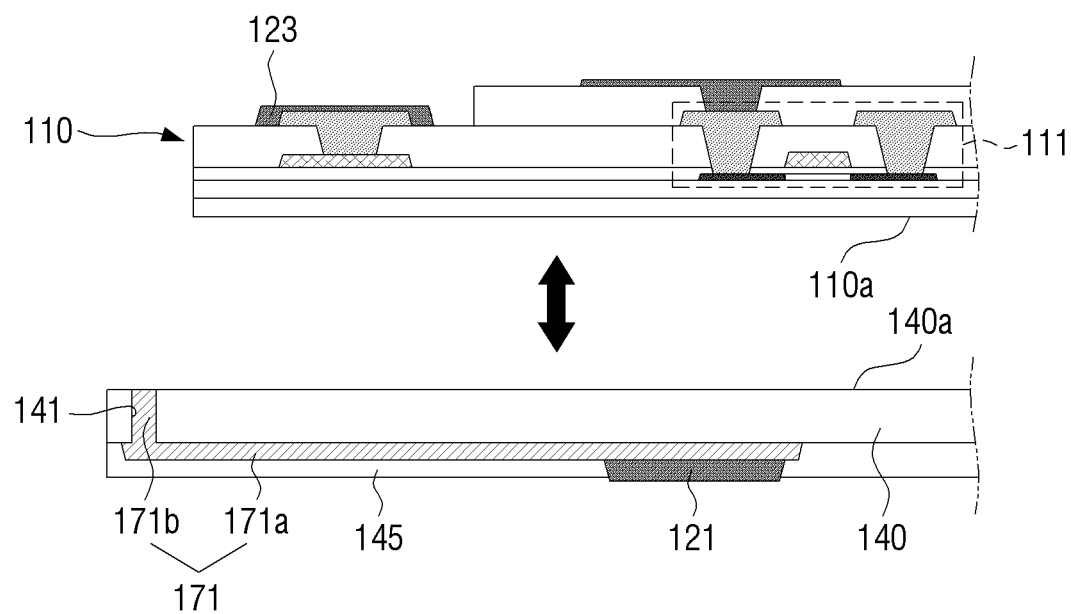
FIGS. 4A to 4C are views illustrating a process of forming a second wiring in a stepped part after attaching a rear substrate which forms a TFT substrate and a first wiring.
Figure 4B:
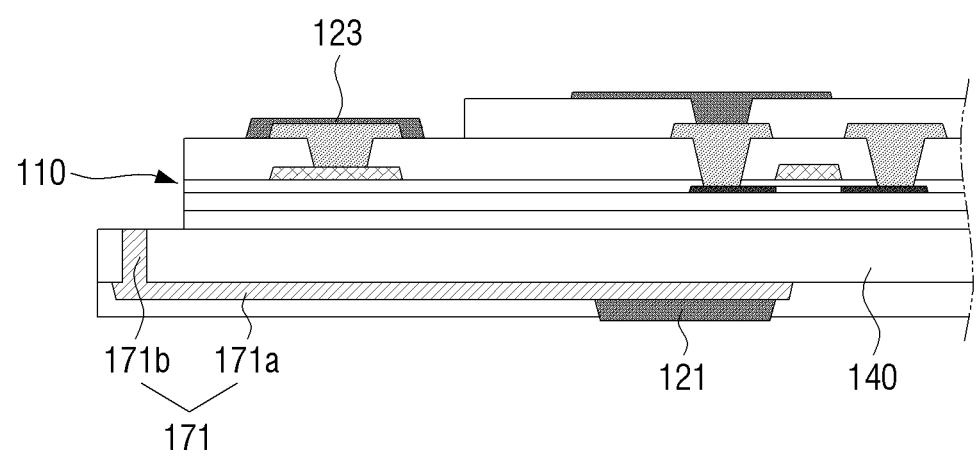
Figure 4C:
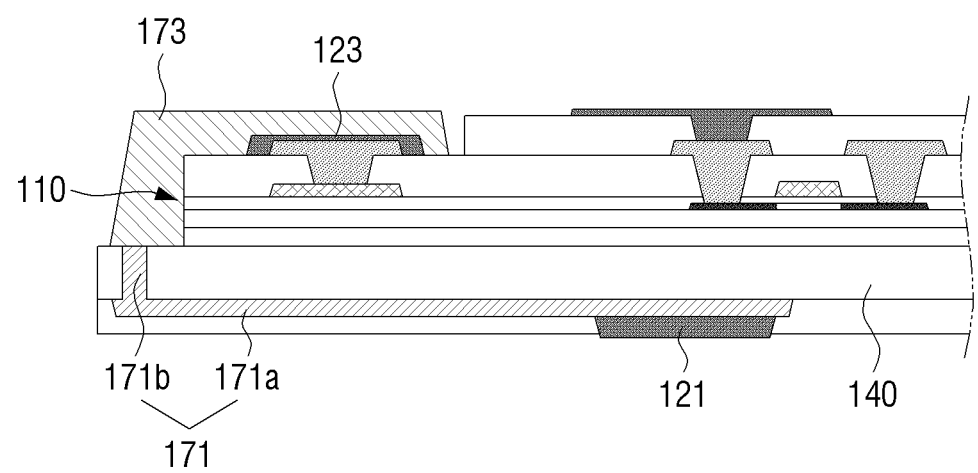

The connection wiring 170 as described above may be formed to electrically interconnect the first and second connection pads 121 and 123 through the process illustrated in FIGS. 4A to 4C. In FIGS. 4A to 4C, the illustration of the plurality of pixels 130 placed on the TFT substrate 110 has been omitted for convenience of description.

Referring to FIG. 4A, the TFT substrate 110 may be produced by forming a plurality of wiring patterns and a plurality of transistors through multiple photolithography processes on the base film 115.

Separate from the TFT substrate 110 process, the via hole 141 may be perforated in the edge part of the rear substrate 140. Next, the via hole wiring 171b which forms a part of the first wiring may be formed in the via hole 141, and by forming the extension wiring 171a which electrically interconnects the via hole wiring 171b and the first connection pad 121 on the rear surface of the rear substrate 140, the first wiring 171 may be formed on the rear substrate 140.

After forming the first wiring 171, the protection layer 145 may be formed on the rear substrate 140 so as to cover the first wiring 171 to protect the first wiring 171. It may be preferable for the protection layer 145 to be formed of an insulating material.

As described above, because the rear substrate 140 is configured so that the first wiring 171a is formed in a process separate from the TFT substrate 110, the rear substrate is not inserted into the TFT substrate 110 process. Accordingly, the various problems which appear as the rear substrate 140 is exposed to high temperature may be fundamentally prevented. The various problems described above may be problems such as a crack occurring in the rear substrate 140 based on the via hole 141 as the via hole wiring 171b formed in the via hole 141 expands in high temperature or the rear substrate 140 being contaminated in the TFT substrate 110 production process.

Referring to FIG. 4B, the front surface 140a of the rear substrate 140 may be bonded with each other to the rear surface 110a of the TFT substrate 110 produced respectively through different processes from each other. In the rear substrate 140, an alignment key (not shown) may be formed to align the rear substrate 140 and the TFT substrate 110. The alignment key may be formed as a mark hole of a several μm basis or in a predetermined marking pattern.

The alignment between the rear substrate 140 and the TFT substrate 110 may be made considering the forming of the stepped part to which the second wiring 173 may be applied by the edge part of the TFT substrate 110 and the edge part of the rear substrate 140.

Referring to FIG. 4C, the second wiring 173 may be formed to the stepped part which is formed on the TFT substrate 110 and rear substrate 140 bonded to each other. The second wiring 173 may be formed through the deposition process or the printing process as described above.

In addition, the display panel 100 according to an embodiment may be produced through a step different from the above-described method. Another example of the production method of the display panel 100 will be described below with reference to FIGS. 5A to 5D.

FIGS. 5A to 5D are views illustrating a process of forming a first wiring at a rear substrate after attaching a TFT substrate and a rear substrate and forming a second wiring in a stepped part.

Figure 5A:
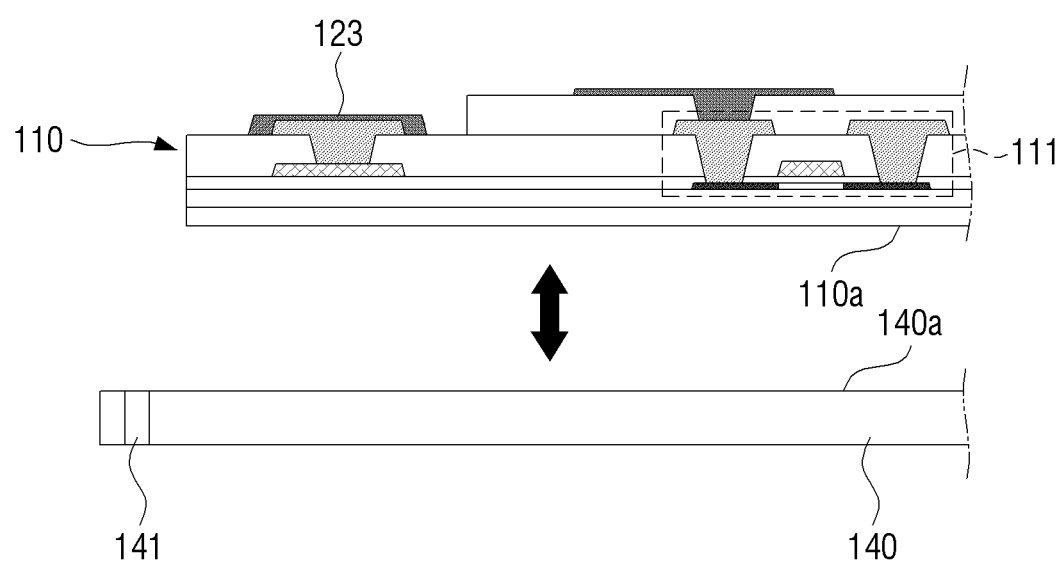
FIGS. 5A to 5D are views illustrating a process of forming a first wiring at a rear substrate after attaching a TFT substrate and a rear substrate and forming a second wiring in a stepped part.
Figure 5B:
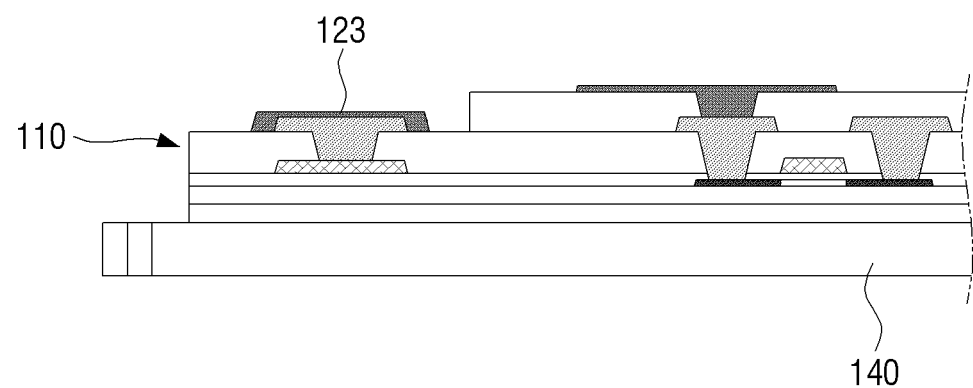

Referring to FIG. 5A, a plurality of patterns and a plurality of transistors may be formed on the base film 115 through a lithography process to produce the TFT substrate 110.

Then, a rear cover 140 may be prepared prior to the first wiring 171 being formed. After a via hole 141 is formed on the rear cover 140, the front surface 140a of the rear cover 140 may be bonded to the rear surface 110a of the TFT substrate 110 as in FIG. 5A. In this case, the rear substrate 140 and the TFT substrate 110 may be bonded in an aligned state through the alignment key (not shown) which is formed on the rear substrate 140.

The via hole 141 which is formed on the rear substrate 140 may be formed prior to the TFT substrate 110 and the rear substrate 140 being bonded to each other, but is not limited thereto, and may be formed on the rear substrate 140 after the TFT substrate 110 and the rear substrate 140 are bonded to each other.

Figure 5C:
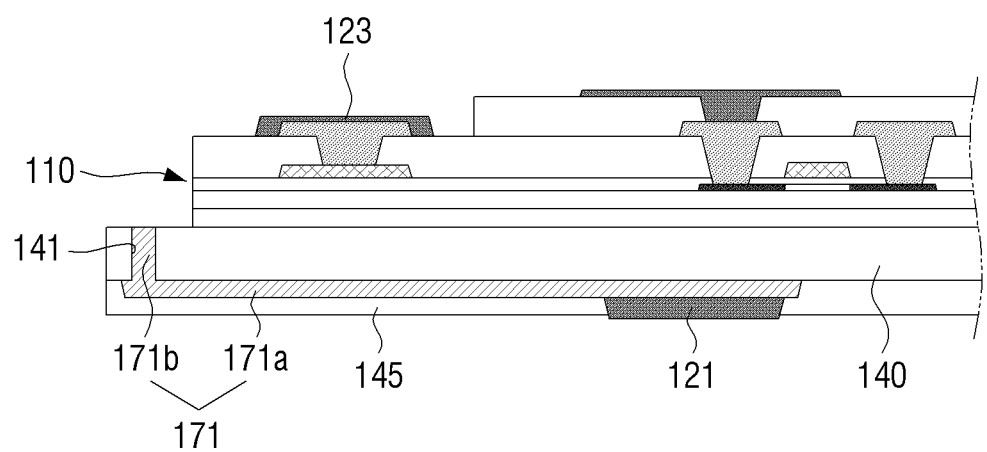

Referring to FIG. 5C, the via hole wiring 1271b which forms a part of the first wiring may be formed in the via hole 141, and by forming the extension wiring 171a which electrically interconnects the via hole wiring 171b and the first connection pad 121 on the rear surface of the rear substrate 140, the first wiring 171 may be formed on the rear substrate 140.

After forming the first wiring 171, the protection layer 145 may be formed on the rear substrate 140 so as to cover the first wiring 171 to protect the first wiring 171. It may be preferable for the protection layer 145 to be formed of an insulating material.

Figure 5D:
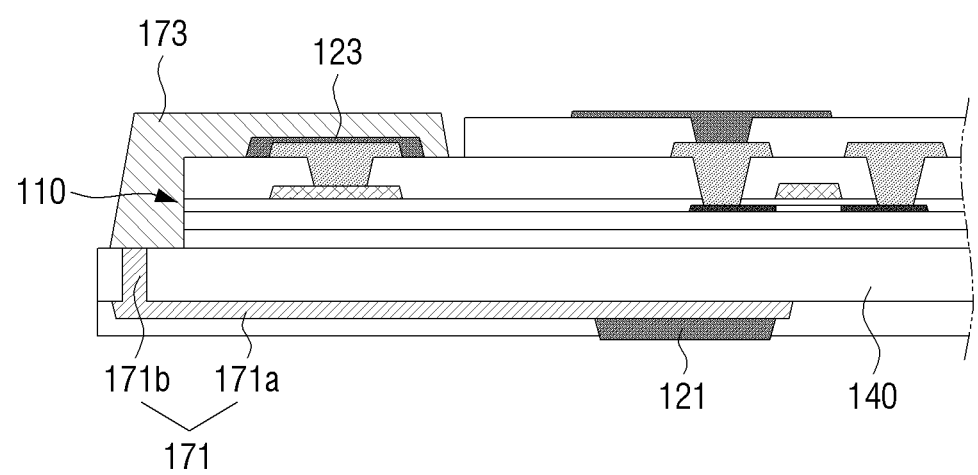

Referring to FIG. 5D, the second wiring 173 may be formed in the stepped part which is formed on the TFT substrate 110 and the rear substrate 140 bonded to each other. In this case, the second wiring 173 may be formed through the deposition process or the printing process as described above.

The above-described second wiring 173 may be formed as wiring of a pattern type by depositing or coating a conductive material to the stepped part. However, the embodiment is not limited thereto, and may be produced as a metal wiring type as in FIG. 6.

Figure 6:
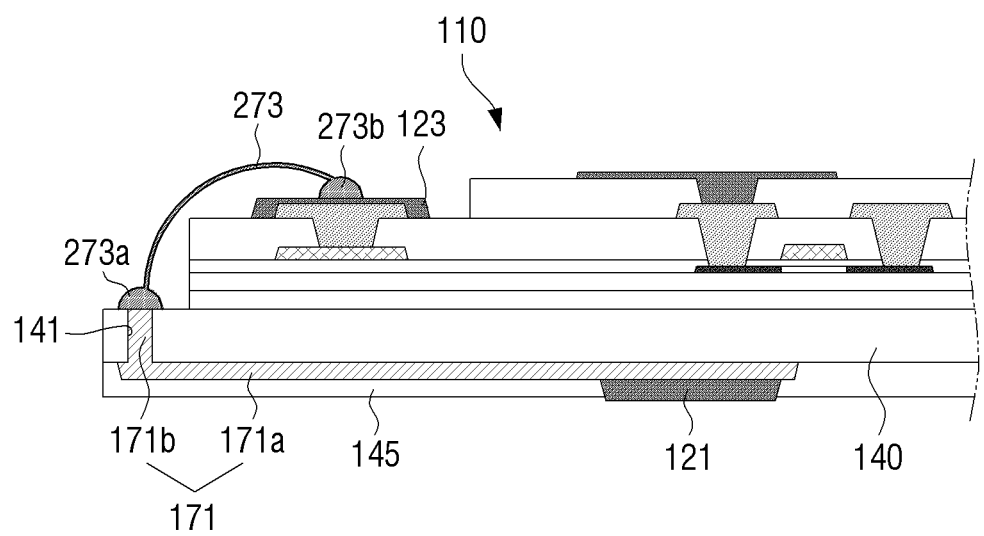
FIG. 6 is a view illustrating an example of a second wiring formed in a stepped part being comprised in a metal wire form.

FIG. 6 is a view illustrating an example of a second wiring formed in a stepped part being comprised in a metal wire form.

Referring to FIG. 6, a second wiring 273 may be configured so that a one end 273a is electrically connected to the via hole wiring 171b, and a other end 273b is electrically connected to the second connection pad 123. As described above, when the second wiring 273 is formed as a metal wiring type, the deposition process or the printing process may be omitted.

Figure 7:
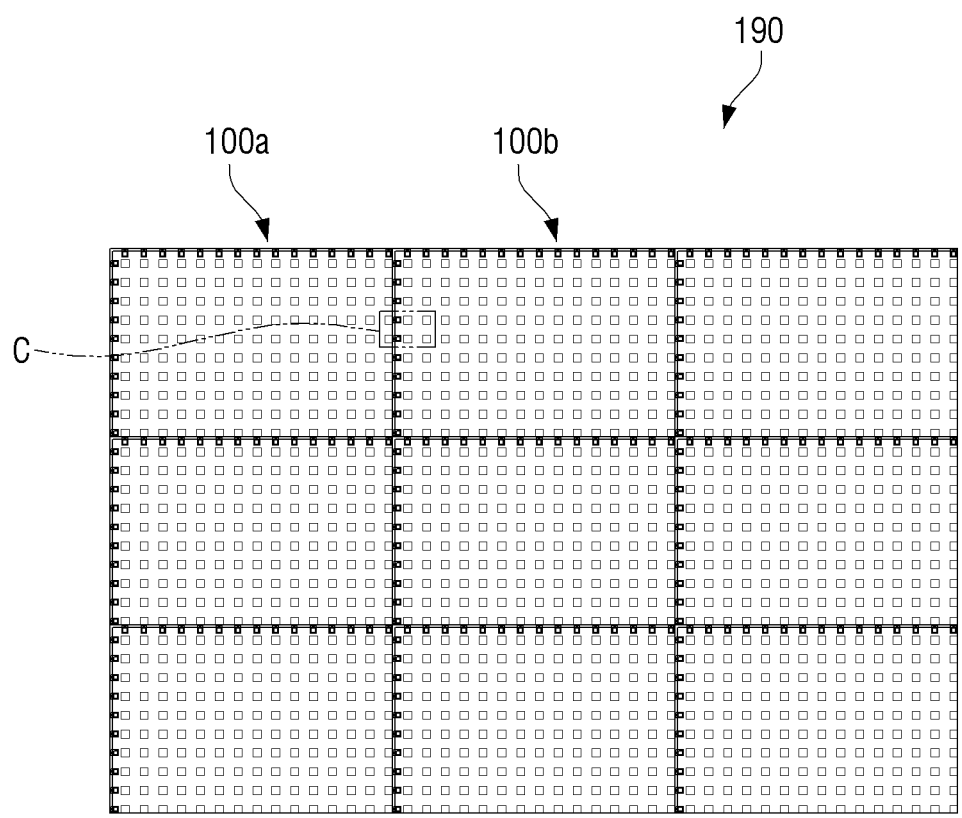
FIG. 7 is a view illustrating a large display device produced by connecting a plurality of display panels.
Figure 8:
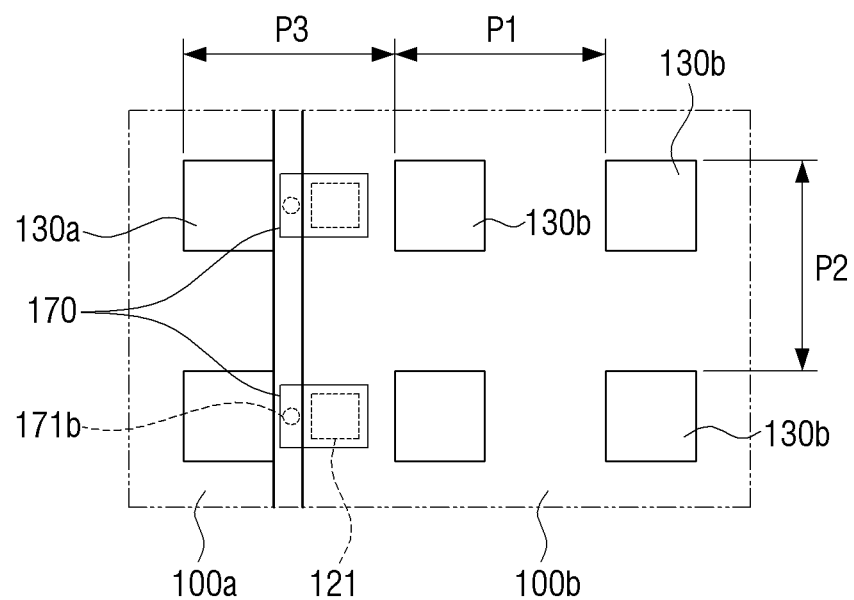
FIG. 8 is an enlarged view illustrating part C illustrated in FIG. 7.

FIG. 7 is a view illustrating a large display device produced by connecting a plurality of display panels, and FIG. 8 is an enlarged view illustrating part C illustrated in FIG. 7.

Referring to FIG. 7, a large display device 190 may be formed by connecting in plurality the display panel according to an embodiment capable of implementing the bezel-less technology as described above.

Referring to FIG. 8, the pixels of the display panels 100a and 100b adjacent to each other which comprise the large display device 190 may be placed to pitches P1, P2 and P3 that are identical to each other. Specifically, the pitch P3 of the pixel 130a of the first display panel 100a and the pixel 130b of the second display panel 100b adjacent thereto may be formed to be identical with the pitches P1 and P2 of the pixels 130b within the second display panel 100b.

By adjusting the distance from one end of the pixel 130a of the first display panel 100a to one end of the pixel of the second display panel 130b, the pitch of the pixels of each of the display panels 100a and 100b and the pitch of each of the pixels 130a and 130b adjacent to each other of the first and second display panels 100a and 100b may be identically maintained.

The distance between the one end of the pixel 130a of the first display panel 100a to the one end of the pixel of the second display panel 130b may correspond to a width of the stepped part of the second display panel 100b. Accordingly, by adjusting the width of the stepped part of the second display panel 100b, the pitch P3 of the pixels 130a and 130b adjacent to each other of each of the display panels 100a and 100b may be identically maintained with other pitches P1 and P2.

Based on the width of the stepped part of the second display panel 100b being formed narrower than the pitch P3, a predetermined gap G may be formed in-between the first and second display panels 100a and 100b. In this case, based on the pitch P3 being maintained identically with that of the other pitches P1 and P2, it may be difficult to check by the naked eye a seam at the connecting part of each display panel due to the gap G, when viewing an image displayed by the plurality of pixels in the large display device 190. Accordingly, the large display device 190 formed by connecting in plurality the display panel 100 implemented with the bezel-less technology may have the same effect as being formed of a single display panel.

The above-described display panel 100 has been described as the plurality of wirings 170 being formed at an upper side and left side of the TFT substrate 110 as in FIG. 1, but is not limited thereto, and the plurality of wirings 170 may be formed at one or more sides from among the four sides of the TFT substrate 110.

For example, the plurality of wirings 170 may be formed at various locations such as the upper side and a lower side of the TFT substrate 110, the upper side and a right side of the TFT substrate 110, the left side and the right side of the TFT substrate 110, only at one side from among the four sides of the TFT substrate 110, or only at three sides from among the four sides of the TFT substrate 110.

As described above, according to the various embodiments of the disclosure, a bezel-less display panel may be easily implemented by forming wiring for electrically connecting the front surface and the rear surface of the TFT substrate to the stepped part of the display panel.

In addition, based on the active area in which pixels are placed increasing relative to the dummy area decreasing on the TFT substrate, the pixels may be arranged more densely.

In addition, when a large display device is formed by connecting a plurality of bezel-less display panels, the display quality may be improved due to a seam not appearing in the part where each of the display panels are connected.

Each of the elements (e.g., module or program) according to the various embodiments described above may be configured to a singular entity or a plurality of entities, and some sub-elements from among the corresponding sub-elements described above may be omitted or other sub-elements may be further included in the various embodiments. Alternatively or additionally, some elements (e.g., module or program) may be integrated as one entity, and may perform identically or similarly the function performed by the each of respective elements prior to integration. The operations performed by the module or program according to the various embodiments or other elements may be performed consecutively, in parallel, repeatedly or heuristically, or at least some operations may be executed in different order, omitted, or another operation may be added.

The above description is merely illustrative of the technical idea of the disclosure, and it will be understood by those of ordinary skill in the art that various changes in form and details may be made therein without departing from the spirit and scope of the disclosure. In addition, the embodiments disclosed herein are not intended to limit the scope of the disclosure but to describe the technical spirit of the disclosure, and the scope of the technical spirit of the disclosure is not limited to the embodiments. Therefore, the scope of protection in the disclosure is to be construed according to the following claims, and all the technical spirits within the equivalent scope is within the scope of the appended claims.

What is claimed is:

1. A display panel, comprising:
    a thin film transistor (TFT) substrate;
    a plurality of micro light emitting diodes (LEDs) arranged at one surface of the TFT substrate;
    a rear substrate having a one surface coupled to a other surface of the TFT substrate and having at least a part of an edge protruding further than an edge of the TFT substrate to form a stepped part with the TFT substrate; and
    a plurality of wirings formed at the stepped part and a other surface of the rear substrate to electrically connect the one surface of the TFT substrate with the other surface of the rear substrate,
    wherein each of the plurality of wirings comprise:
        a first wiring formed to extend from the other surface of the rear substrate and penetrate an edge part of the rear substrate; and
        a second wiring formed in the stepped part to electrically connect with the first wiring, and
    wherein a via hole is formed in an area corresponding to the rear substrate in the stepped part, and a part of the first wiring is formed in the via hole.

2. The display panel of claim 1, wherein the second wiring is electrically connected from a part of the first wiring formed in the via hole along the stepped part to the first connection pad placed on one surface of the TFT substrate.

3. The display panel of claim 2, wherein the second wiring is formed in a pattern type applied to the stepped part.

4. The display panel of claim 2, wherein the second wiring is formed as a metal wiring type.

5. The display panel of claim 1, wherein the rear substrate further comprises a protection layer configured to cover the first wiring.

6. The display panel of claim 1, wherein the rear substrate is comprised of any one from among a Polyimide (PI), a Polyethylene Terephthalate (PET), a Polyethersulfone (PES), a Polyethylene Naphthalate (PEN) or Polycarbonate (PC).

7. The display panel of claim 1, wherein the rear substrate is a flexible plastic film.

8. The display panel of claim 1, wherein the rear substrate is a glass film.

9. The display panel of claim 1, wherein the TFT substrate comprises:
   a flexible film substrate; and
   a plurality of TFT wiring layers formed on the flexible film substrate.

10. A display panel, comprising:
   a substrate to which a stepped part is formed at an edge;
   a plurality of micro light emitting diodes (LED) arranged at one surface of the substrate;
   a first wiring extending to a via hole formed at the rear substrate of the substrate and the stepped part; and
   a second wiring formed in the stepped part to electrically connect the first wiring exposed in the via hole with a connection pad formed on a front surface of the substrate.

11. The display panel of claim 10, wherein the substrate comprises:
   a TFT substrate; and
   a rear substrate coupled to a rear surface of the TFT substrate and formed with a synthetic resin.

12. A large display device with a plurality of display panels consecutively connected,
   wherein each of the display panels comprise: a thin film transistor (TFT) glass substrate; a plurality of micro light emitting diodes (LEDs) arranged at one surface of the TFT substrate; a rear substrate having a one surface coupled to a other surface of the TFT substrate and having at least a part of an edge protruding further than an edge of the TFT substrate to form a stepped part with the TFT substrate; and a plurality of wirings formed at the stepped part and a other surface of the rear substrate to electrically connect the one surface of the TFT substrate with the other surface of the rear substrate;
   wherein the micro LED is configured to form one pixel per three micro LEDs, and
   wherein a plurality of pixels provided in each of the display panels is placed to an identical first pitch, and pixels of display panels which are adjacent to each other from among the pixels of the display panel is placed to a second pitch identical to the first pitch.

* * * * *